(12) United States Patent
Herrick et al.

(10) Patent No.: US 7,795,896 B2
(45) Date of Patent: Sep. 14, 2010

(54) HIGH-POWER OPTICAL BURN-IN

(75) Inventors: Robert W. Herrick, San Jose, CA (US); Charles B. Roxlo, Saratoga, CA (US); T. H. Ola Sjolund, Morgan Hill, CA (US); Tsurugi Sudo, San Jose, CA (US)

(73) Assignee: Finisar Corporation, Sunnyvale, CA (US)

( * ) Notice: Subject to any disclaimer, the term of this patent is extended or adjusted under 35 U.S.C. 154(b) by 147 days.

(21) Appl. No.: 12/190,914

(22) Filed: Aug. 13, 2008

(65) Prior Publication Data

US 2010/0039134 A1 Feb. 18, 2010

(51) Int. Cl.
*G01R 31/26* (2006.01)

(52) U.S. Cl. ........................ 324/765; 324/760

(58) Field of Classification Search ........................ None
See application file for complete search history.

(56) References Cited

U.S. PATENT DOCUMENTS

| 4,796,996 A * | 1/1989 | Burns ........................ 356/256 |
| 5,446,537 A | 8/1995 | Yoshida et al. |
| 6,249,140 B1 | 6/2001 | Shigihara |
| 2004/0135595 A1 | 7/2004 | Chen et al. |
| 2006/0118702 A1* | 6/2006 | Posamentier et al. .... 250/214 R |
| 2008/0089378 A1 | 4/2008 | Kamiyama et al. |

FOREIGN PATENT DOCUMENTS

JP    2004-047568    2/2004

OTHER PUBLICATIONS

International Search Report and Written Opinion dated Mar. 18, 2010, as issued in International Application No. PCT/US2009/053781 filed Aug. 13, 2009.

* cited by examiner

*Primary Examiner*—Vinh P Nguyen
(74) *Attorney, Agent, or Firm*—Workman Nydegger (57) ABSTRACT

Semiconductor lasers are aged to identify weak or flawed devices, resulting in improved reliability of the remaining devices. The lasers can be aged using a high-power optical burn-in that includes providing a high drive current to the lasers for a period of time, and maintaining the ambient temperature of the lasers at a low temperature. After the high-power optical burn-in, the output of the lasers can be measured to determine if the lasers are operating within specifications. Those that are not can be discarded, while those that are can be further aged using a high-temperature thermal burn-in that includes providing a drive current to the lasers while maintaining the ambient temperature of the lasers at a high-temperature.

9 Claims, 7 Drawing Sheets

HIGH-POWER OPTICAL BURN-IN

BACKGROUND OF THE INVENTION

1. The Field of the Invention

The present invention relates generally to testing of semiconductor lasers. More specifically, embodiments of the invention relate to a high-power optical burn-in.

2. The Related Technology

Burn-in procedures are commonly utilized in production of optical components, such as laser diodes. Due to inconsistencies in manufacturing techniques and materials, optical components can have actual life cycles that differ significantly from design or theoretical life cycles. Industry norm is to operate optical components for an extended period at the manufacturing facility with the hope that those optical components having a less than desired life cycle fail during initial operation. These failed optical components, therefore, never exit from the manufacturing facility to interrupt data flowing in an optical network.

In the case of conventional laser diode manufacture, burn-in of laser diodes includes operating the laser diodes at elevated ambient temperatures for an extended period. This type of burn-in is often referred to as high-temperature thermal burn-in ("TBI"). The high-temperature condition makes the material of a laser diode softer by heating up the lattice, allowing point defects and dislocations to move through the material more easily than at low temperature. Thus, operating laser diodes at these elevated temperatures for a long period facilitates the identification of flawed and/or weak devices, thereby screening out those laser diodes having a tendency to fail prematurely.

Conventional TBI processes have been found to be adequate for screening certain types of lasers, such as 10 G lasers made of indium gallium arsenide phosphide ("InGaAsP"), which have an inherently reliable structure due to the semiconductor materials used. Notably, however, conventional TBI can fail to properly screen lasers made from other materials, such as indium aluminum gallium arsenide ("InAlGaAs"), which may have an inherently less reliable structure. Even so, lasers made from InAlGaAs may be desirable over lasers made from InGaAsP due to improved performance characteristics at high speeds and/or high-temperatures.

The subject matter claimed herein is not limited to embodiments that solve any disadvantages or that operate only in environments such as those described above. Rather, this background is only provided to illustrate one exemplary technology area where some embodiments described herein may be practiced

BRIEF SUMMARY OF THE INVENTION

This Summary is provided to introduce a selection of concepts in a simplified form that are further described below in the Detailed Description. This Summary is not intended to identify key features or essential characteristics of the claimed subject matter, nor is it intended to be used as an aid in determining the scope of the claimed subject matter.

Embodiments of the invention relate to methods for aging one or more semiconductor lasers to identify weak or flawed devices and can include a high-power optical burn-in ("OBI") process. The high-power OBI according to embodiments of the invention can include providing a relatively high drive current to one or more lasers being tested. The relatively high drive current may range from three to four times the normal operating bias current at elevated temperatures (e.g., 85° C.). The ambient temperature during the high-power OBI can be maintained at or around a relatively low temperature, such as 50° Celsius or lower. The relatively high drive current and relatively low temperature can be maintained for a particular period of time, which may be five hours or more in some embodiments.

Once the high-power OBI terminates, the optical output power of the laser can be measured to determine whether the laser is still operating within specifications. The optical output power after the high-power OBI can be compared to the optical output power measured prior to the high-power OBI, and/or to a specified minimum value.

In some embodiments, the laser can be further subjected to a high-temperature TBI to identify any flawed or weak devices not identified by the high-power OBI. During the high-temperature TBI, the ambient temperature of the laser may be maintained at a temperature of approximately 85° Celsius.

Additional features and advantages of the invention will be set forth in the description which follows, and in part will be obvious from the description, or may be learned by the practice of the invention. The features and advantages of the invention may be realized and obtained by means of the instruments and combinations particularly pointed out in the appended claims. These and other features of the present invention will become more fully apparent from the following description and appended claims, or may be learned by the practice of the invention as set forth hereinafter.

BRIEF DESCRIPTION OF THE DRAWINGS

To further clarify the above and other advantages and features of the present invention, a more particular description of the invention will be rendered by reference to specific embodiments thereof which are illustrated in the appended drawings. It is appreciated that these drawings depict only typical embodiments of the invention and are therefore not to be considered limiting of its scope. The invention will be described and explained with additional specificity and detail through the use of the accompanying drawings in which.

DETAILED DESCRIPTION OF THE PREFERRED EMBODIMENTS

Embodiments of the invention relate to methods and systems for testing optoelectronic devices, such as, but not limited to, laser diodes. The methods and systems of the present invention provide for the identification of defective and/or unreliable laser diodes that conventional TBI methods fail to identify. Contrary to conventional TBI aging, embodiments of the invention include device burn-in processes that are performed at a relatively high drive current (such as three to four times the normal operating bias current at elevated temperature), and relatively low temperatures, such as room temperature. Embodiments of the invention can facilitate the identification of faulty optoelectronic devices to improve reliability of the devices ultimately distributed to customers of laser manufacturers/distributors.

Reference will now be made to figures wherein like structures will be provided with like reference designations. It is understood that the drawings are diagrammatic and schematic representations of presently preferred embodiments of the invention, and are not limiting of the present invention nor are they necessarily drawn to scale.

I. Example Operating Environment

Figure 1:
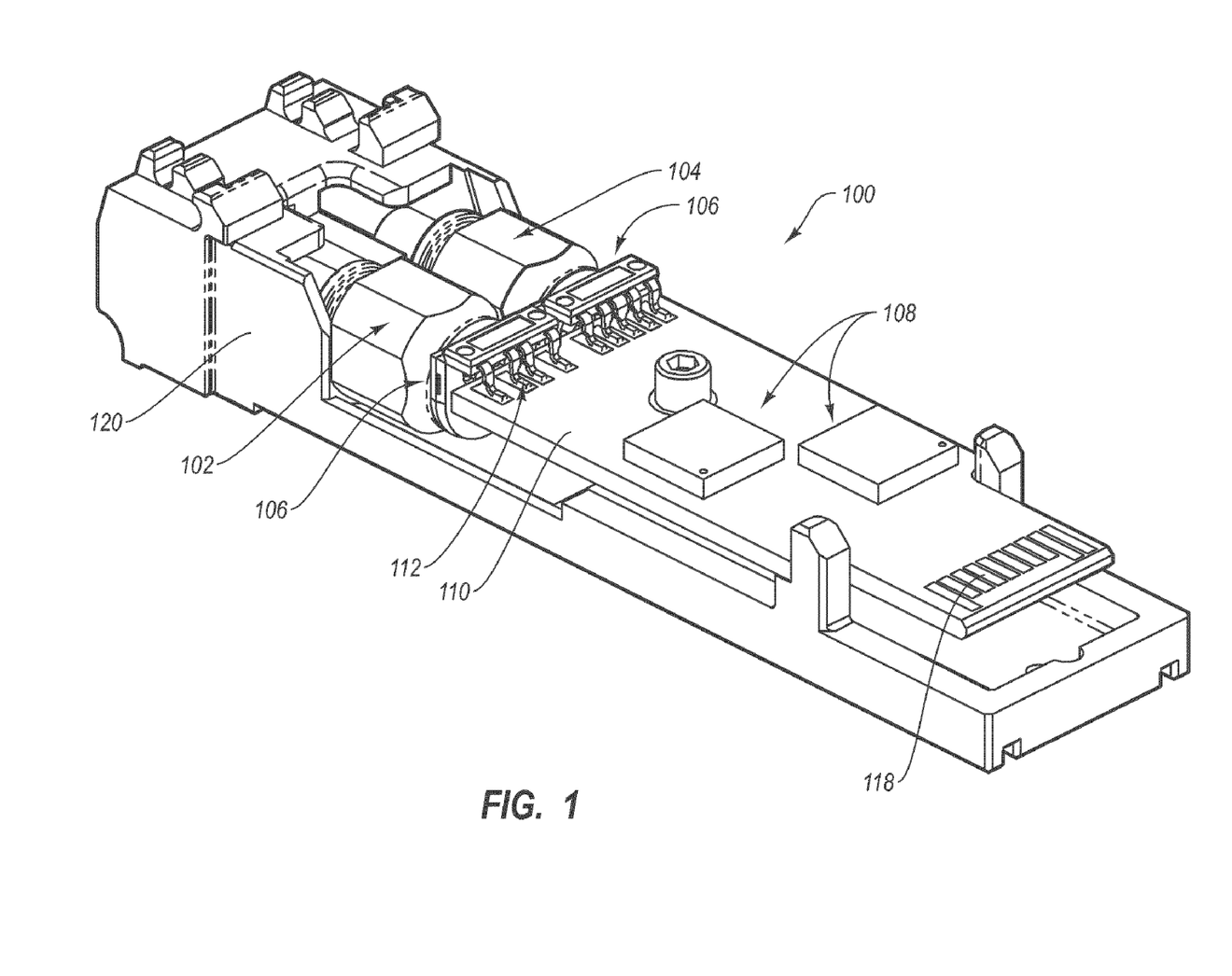
FIG. 1 illustrates an example operating environment in which embodiments of the invention can be implemented.

Reference is first made to FIG. 1, which discloses a perspective view of an optical transceiver module ("transceiver"), generally designated at 100, for use in transmitting and receiving optical signals in connection with an external host that is operatively connected in one embodiment to a communications network (not shown). As depicted, the transceiver shown in FIG. 1 includes various components, including a receiver optical subassembly ("ROSA") 102, a transmitter optical subassembly ("TOSA") 104, electrical interfaces 106, various electronic components 108, and a printed circuit board ("PCB") 110. The PCB 110 includes a plurality of conductive pads 112 and an edge connector 118. The components of the transceiver 100 can be partially housed within a shell 120.

The optical transceiver 100 is described by way of illustration only, and not by way of restricting the scope of the invention. The optical transceiver 100 can be configured for optical signal transmission and reception at a variety of per-second data rates, including, but not limited to, 1 Gigabit per second ("G"), 2 G, 2.5 G, 4 G, 8 G, 10 G, 17 G, 25 G, or higher data rates. Furthermore, the optical transceiver 100 can be configured for optical signal transmission and reception at various wavelengths including, but not limited to, 850 nm, 1310 nm, 1470 nm, 1490 nm, 1510 nm, 1530 nm, 1550 nm, 1570 nm, 1590 nm, or 1610 nm. In addition, the principles of the present invention can be implemented in optical transceivers or transponders of any form factor such as XFP, SFP, SFF, XENPAK, X2, 300-pin, without restriction. Having said that, the principles of the present invention are not restricted to an optical transceiver or transponder environment at all.

The TOSA 104 of the transceiver 100 is one example of an optical transmitter that can employ an optical signal source, such as a semiconductor laser, that is configured according to embodiments of the invention. Briefly, in operation the transceiver 100 receives electrical signals from a host (not shown), or other data signal-producing device to which the transceiver is operably connected, for transmission onto an optical fiber operably connected to the TOSA 20. Circuitry of the transceiver 100 drives an optical signal source, such as a semiconductor laser (described below), within the TOSA 104 with signals that cause the TOSA to emit onto the optical fiber optical signals representative of the information in the electrical signal provided by the host. Accordingly, the TOSA 104 serves as an electro-optic transducer.

Having described a specific environment with respect to FIG. 1, it will be understood that this specific environment is only one of countless architectures in which the principles of the present invention may be employed. As previously stated, the principles of the present invention are not intended to be limited to any particular environment.

II. Example Semiconductor Laser

Figure 2:
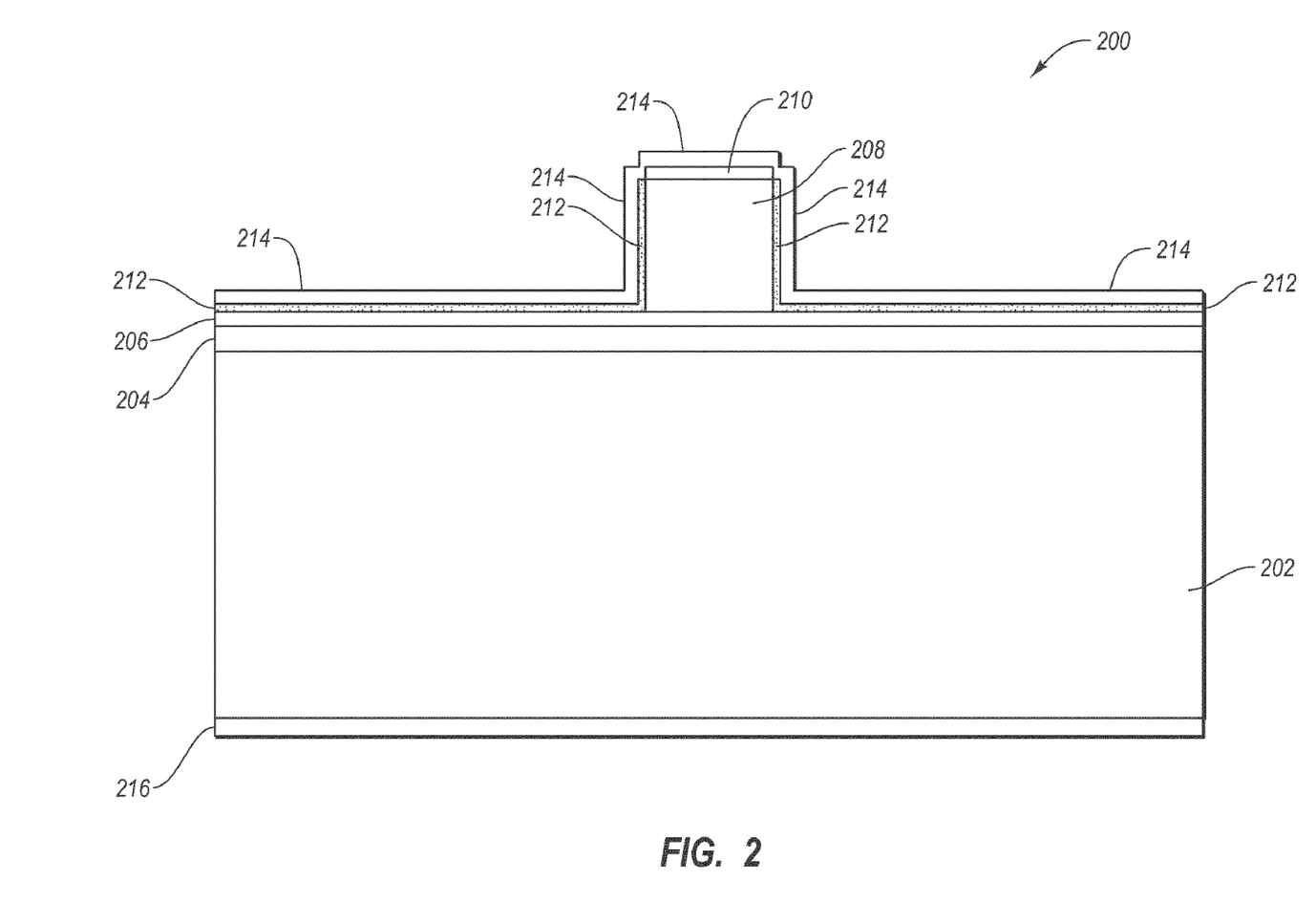
FIG. 2 illustrates an example of a laser diode that can be implemented in the operating environment of FIG. 1.

Together with FIG. 1, reference is now made to FIG. 2, which illustrates a cross-sectional view of a semiconductor laser. In particular, FIG. 2 discloses a ridge waveguide ("RWG") laser 200, which is one example of a semiconductor laser that can be employed according to embodiments of the invention. The RWG laser 200 disclosed in FIG. 2 can be implemented as a Fabry-Perot ("FP") RWG laser. For instance, the RWG laser 200 may comprise a 10 G cooled or uncooled FP RWG laser. Alternately, the RWG laser may comprise a 17 G or 25 G (or other data rate) cooled or uncooled FP RWG laser. Alternately, the RWG laser 200 can be implemented as a distributed feedback ("DFB") RWG laser. It should be noted that the principles of the present invention can be extended to other laser types configured for the same or other data transmission rates.

The RWG laser 200 can include, for instance, InAlGaAs, although other semiconductor materials can alternately or additionally be included in the RWG laser 200. One skilled in the art will appreciate that InAlGaAs lasers may perform better at high speeds than more conventional InGaAsP lasers, while simultaneously being less reliable due to self-propagating dark line defects in InAlGaAs. Accordingly, embodiments of the invention include methods for aging and screening InAlGaAs and other semiconductor lasers, as described in greater detail below.

As disclosed in FIG. 2, the RWG laser 200 includes a substrate 202, a multiple quantum well ("MQW") active layer 204 disposed above the substrate 202, a semiconductor spacer layer 206 disposed above the active layer 204, and a ridge structure 208 disposed above semiconductor spacer layer 206. The RWG laser 200 also includes a contact layer 210 disposed above the ridge 208. According to embodiments of the invention, layers 204-210 can be epitaxially grown, for example.

In addition, the RWG laser 200 can optionally include a dielectric passivation layer 212 disposed above semiconductor spacer layer 206 and laterally bordering either side of the ridge structure 208. Further, the RWG laser 200 includes a top metallic contact layer 214 disposed above both the dielectric passivation layer 212 and the contact layer 210 and laterally bordering the portions of the dielectric passivation layer 212 that are laterally bordering either side of the ridge structure 208. Additionally, the RWG laser 200 includes a bottom metallic contact layer 216 disposed beneath the substrate 202. Each of the top metallic contact layer 214 and bottom metallic contact layer 216 can be composed of one or more metal or metal alloy layers including, for instance, titanium, platinum, gold, or the like. In some embodiments of the invention, each of the layers 212-216 is non-epitaxially grown.

Optionally, the RWG laser 200 can include a grating layer (e.g., disposed above the spacer layer 206 and below the ridge structure 208), in which case the RWG laser 200 would be a DFB RWG laser.

The description above of the example semiconductor laser includes both structural and functional characteristics of a RWG laser, together with certain details regarding the manufacturing processes used to build the RWG laser. Note, however, that this description is meant to be illustrative only; indeed, lasers and other semiconductor optical devices having structural and/or functional aspects that differ from the above description can also benefit from the principles of embodiments of the invention as disclosed herein. It is also appreciated that additional or alternative layers or structures can be incorporated into the present laser device as will be understood by those of skill in the art.

III. Burn-In of Semiconductor Lasers

Semiconductor lasers can be fabricated in large quantities by growing the epitaxial and/or non-epitaxial layers described above on a semiconductor wafer. Individual lasers are removed from the wafer using common techniques by cleaving and breaking the wafer both horizontally and laterally to separate each laser. After this process, anti-reflective ("AR") and high-reflective ("HR") coating processes can be performed to encapsulate the active region of each laser and provide the requisite reflectivity characteristics of the laser cavity.

Figure 3A:
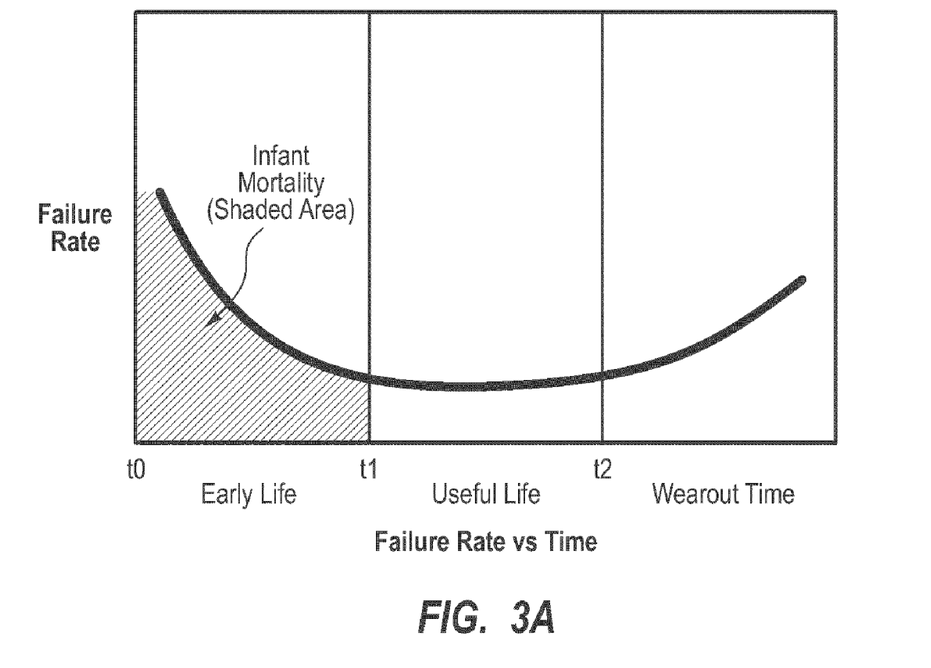
FIGS. 3A and 3B disclose lifetime curves for different sample sets of lasers.

Typically, every wafer that is fabricated generates a number of functionally good laser die. In one example, a wafer may provide 2000 operational laser die. Not all of these 2000 operational laser die, however, are robust enough to withstand aging in a user's hands. In fact, many types of semiconductor lasers have a high "infant mortality" rate, where a substantial number (e.g., 2-10% for some populations) of lasers fail after a relatively short period of use due to manufacturing defects. For instance, FIG. 3A represents cumulative distribution of failures for a laser population as a function of time. Such graphs as in FIG. 3A are often referred to as lifetime curves or bathtub curves because of their shape.

As a response to the high infant mortality rate, semiconductor lasers are typically subjected to performance testing in the form of a high-temperature TBI procedure. During a burn-in procedure, the laser is operated at a specific current and temperature for a fixed duration. The laser is then tested to see if it is still performing within desired specifications. Performing burn-in allows flawed devices to be identified before they are incorporated into larger product assemblies or shipped to customers. This leads to increased reliability for the remaining lasers that are incorporated into products in the field.

Conventional burn-in techniques include high-temperature TBI, which generally involves operating a laser at high temperature (e.g., approximately 85° Celsius or higher) and high current (e.g. about 2 times the normal operating bias current) for a particular duration (usually several hours, for example). While conventional TBI has proven adequate for screening InGaAsP lasers, it may not be adequate for screening some InAlGaAs lasers. It will be appreciated by those skilled in the art that equipment vendors and other customers of laser manufacturers may find the high failure rate of InAlGaAs lasers to be undesirable and/or unacceptable, despite their improved performance compared to conventional lasers.

To that end, embodiments of the invention include methods for aging one or more FP and other semiconductor lasers made of InAlGaAs and/or other semiconductor materials to determine their reliability and screen out weak lasers. In particular, embodiments of the invention include a high-power OBI. Aspects of the high-power OBI, including duration of the high-power OBI, can be selected using one or more of: lifetime data generated from a population of lasers subjected to a high-power OBI, and reliability data from lasers with a few different durations of high-power OBI applied. Alternately or additionally, the selection of a duration of the high-power OBI can depend on data relating to how the catastrophic optical damage ("COD") threshold falls for a population of aging lasers.

FIGS. 3B-4B disclose lifetime data and reliability data for a plurality of 10 G FP InAlGaAs lasers. Lifetime data and reliability data for slower or faster data rate lasers made from the same or different semiconductor materials having the same or different design parameters are not necessarily identical to that shown in FIGS. 3B-4B and can result in the selection of different values for the duration of the high-power OBI.

One approach taken by laser manufacturers to optimize burn-in duration is to graph the percentage of weak lasers that can be removed as a function of burn-in duration for a particular burn-in, and then determine what the shortest burn-in duration is that can meet customer needs, while leaving some margin for error. For example, FIG. 3B discloses failures as a function of time during a high-power OBI for a population of FP InAlGaAs lasers. Note that the vertical axis of FIG. 3B corresponds to the percentage of failed lasers, rather than failure rate as in FIG. 3A; as a result, the bathtub curve in FIG. 3B looks different compared to the bathtub curve in FIG. 3A.

Figure 3B:
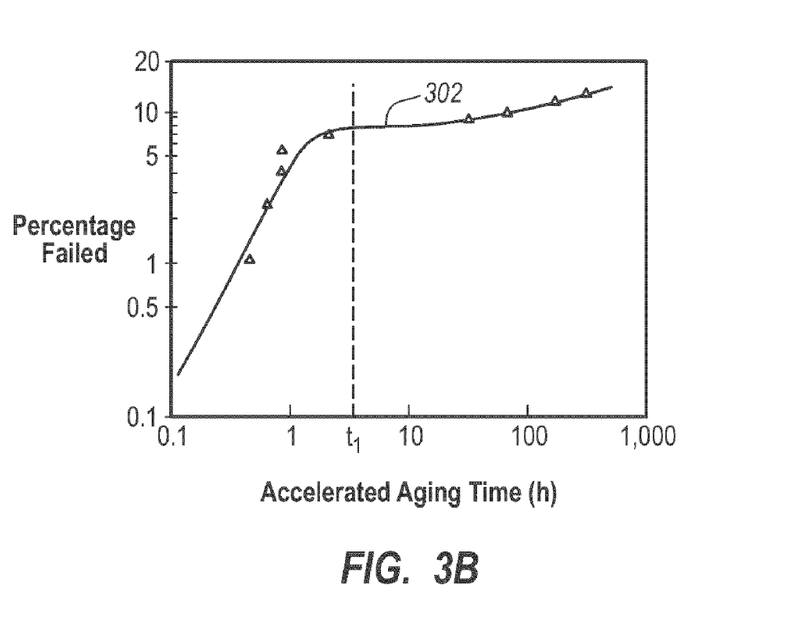

To obtain the data for the curve 302 of FIG. 3B, the population of FP InAlGaAs lasers were subjected to a high-power OBI that included maintaining a relatively low ambient temperature and providing a drive current that is three to four times more than the normal operating bias current of the lasers at elevated temperatures. In particular, the lasers were aged at an ambient temperature of approximately 35° C. The drive current was 200 mA continuous wave ("CW"). The lasers were monitored every few minutes to allow exact times to failure to be noted. Failures, when they occurred, were generally rapid and catastrophic once they passed a certain point. For those that weren't rapid and catastrophic, a 20% reduction in output power was used as the criterion to determine failure time.

As disclosed by curve 302 in FIG. 3B, most failures occur in the first several hours, and later failures occur at a declining rate. Specifically, most failed lasers of the laser population represented by curve 302 can be identified before time $t_1$, which corresponds to approximately two hours on the logarithmically-scaled horizontal axis of FIG. 3B. However, identifying most failed lasers in other laser populations may take longer than two hours in other embodiments and/or not all laser populations necessarily show saturation in just a few hours.

Figure 4A:
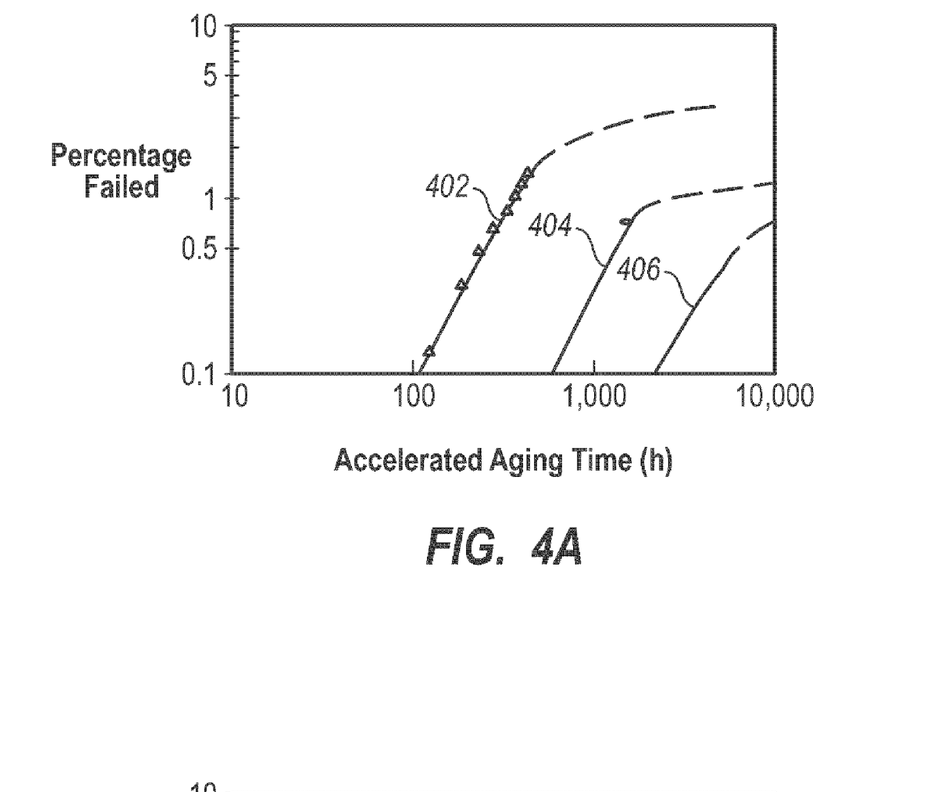
FIGS. 4A and 4B depict lifetime curves for sample sets of InAlGaAs lasers subjected to different durations of high-power OBI.
Figure 4B:
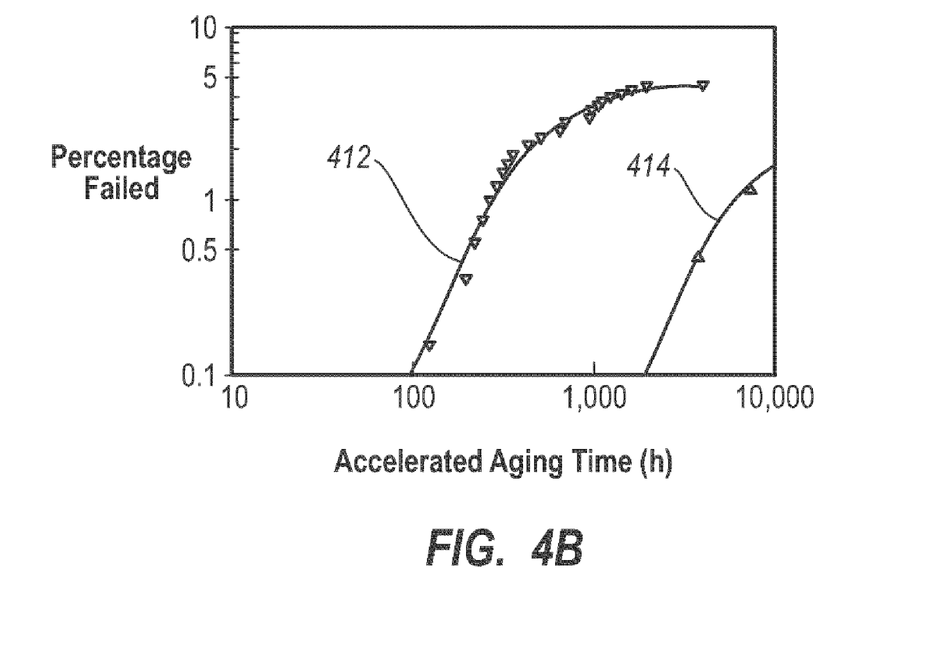

With additional reference to FIGS. 4A and 4B, reliability data from FP InAlGaAs lasers with different durations of high-power OBI according to embodiments of the invention is disclosed. In particular, FIG. 4A includes three curves 402, 404, and 406 corresponding to three sample sets of lasers from a first population of FP InAlGaAs lasers. FIG. 4B includes two curves 412, 414 corresponding to two sample sets of lasers from a second population of FP InAlGaAs lasers.

The first sample set of lasers from the first population were subjected to no high-power OBI (curve 402), the second sample set of the first population were subjected to a five-hour high-power OBI (curve 404), and the third sample set of the first population were subjected to a five-hour high-power OBI plus a sweep OBI (curve 406). The first sample set of lasers from the second population were subjected to no high-power OBI (curve 412), and the second sample set of the second population were subjected to a one-hundred-hour high-power OBI (curve 414). In addition, all of the lasers in the first and second population were subjected to an identical TBI process prior to obtaining the reliability data.

The data in FIGS. 4A and 4B was collected at 100° C. ambient temperature and 120 mA CW drive current (collectively referred to as the "test conditions"). For this data to be useful, it is helpful to know the acceleration of the test conditions above what the lasers would experience under normal conditions. A conservative acceleration factor of 85× is applied herein, the derivation of which is beyond the scope of this document.

The acceleration factor, in conjunction with the time at which 0.1% cumulative failures occurs under the test conditions, can be used to calculate the time at which 0.1% cumulative failures will occur under normal operating conditions. For instance, as shown by curve 402 in FIG. 4A, 0.1% cumulative failures for lasers from the first population with no high-power OBI under the test conditions occurs at approximately 100 hours. Using the conservative acceleration factor of 85×, it can then be calculated that 0.1% cumulative failures in lasers from the first population with no high-power OBI under normal operating conditions occurs in 85×100 hours=8,500 hours, or about 11.6 months. For lasers from the second population with no high-power OBI, it is calculated that 0.1% cumulative failures under normal operating conditions occurs in 85×90 hours=7,650 hours, or about 10.5 months. Cumulative failures of 0.1% in 11.6 months or 10.5 months are unacceptable to most customers; indeed, InAlGaAs laser technology has suffered many delays in commercialization due to such early failure issues.

To improve reliability, the second and third sample sets of the first population were subjected to a five-hour high-power OBI and the second sample set of the second population was subjected to a one-hundred-hour high-power OBI prior to being subjected to the test conditions. During the high-power OBIs, the sample sets were aged at 35° C. ambient temperature and 200 mA CW drive current. For the second sample set of the first population which was subjected to the five-hour high-power OBI, no failures were observed for over 1,500 hours, as indicated by curve 404 in FIG. 4A. For the third sample set of the first population which was subjected to the five-hour high-power OBI plus a sweep OBI (discussed in greater detail below), no failures were observed for over 6,000 hours, as indicated by curve 406 in FIG. 4A. For the second sample set of the second population which was subjected to the one-hundred-hour high-power OBI, no failures were observed for over 2,000 hours, as indicated by curve 414 in FIG. 4B.

Using the conservative 85× acceleration factor, 0.1% cumulative failures for lasers subjected to a five-hour high-power OBI is calculated to occur at approximately fifteen years under normal operating conditions. Additionally, 0.1% cumulative failures for lasers subjected to a five-hour high-power OBI plus sweep OBI is calculated to occur at approximately fifty-eight years under normal operating conditions. Additionally, 0.1% cumulative failures for lasers subjected to a one-hundred-hour OBI is calculated to occur at approximately twenty years under normal operating conditions. Thus, lasers subjected to high-power OBI manifest significantly improved failure-free times compared to lasers not subjected to high-power OBI. Such improved failure-free times are typically acceptable for most customers.

The reliability data of FIG. 4 was obtained for lasers subjected to no high-power OBI or to high-power OBIs of five hours or one-hundred hours duration. Alternately or additionally, other durations for the high-power OBI can be implemented. For instance, the duration of the high-power OBI ("OBI duration") can be adapted depending on various factors, including the design of the lasers, the semiconductor materials used in manufacturing the lasers, and high-power OBI conditions such as ambient temperature and drive current. Accordingly, in some embodiments of the invention, lasers can be subjected to an OBI duration as little as ten minutes. Alternately or additionally, the OBI duration can be five hours, ten hours, twenty hours, one-hundred hours, or the like.

Figure 5:
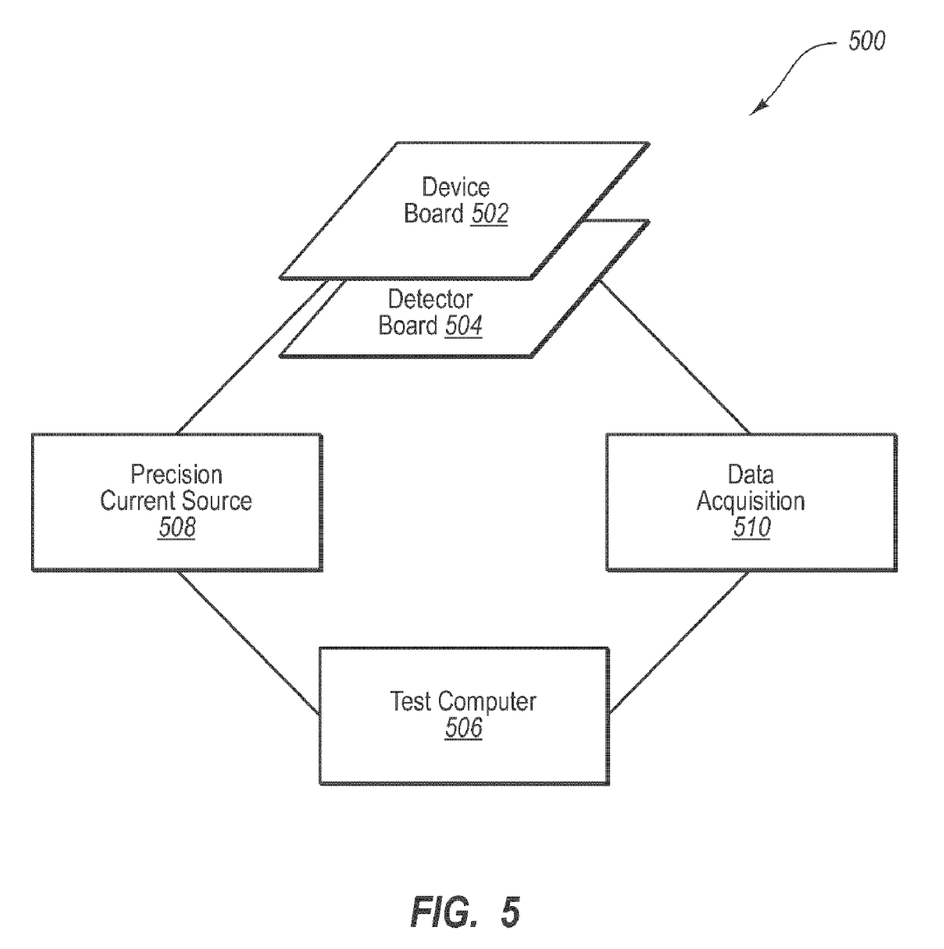
FIG. 5 discloses an example test setup according to embodiments of the invention

Turning now to FIG. 5, a test setup 500 for performing a high-power OBI according to embodiments of the invention is abstractly illustrated in a simplified form. The test setup 500 is only one example of countless test setups that can be implemented for performing high-power OBIs and, as such, should not be construed to limit the invention. The test setup 500 includes a device board 502 for receiving one or more lasers for testing, a detector board 504 with one or more optical detectors, and a computer 506. The test setup 500 can further include drive circuitry 508, such as a precision current source, for driving the lasers to emit optical signals, and data acquisition circuitry 510 for collecting data from the detector board 504. The optical detectors included in the detector board 504 can be configured to sense the optical signals generated by the lasers and/or measure the optical output power of the lasers.

Although not shown, the test setup 500 can further include a climate-controlled environment, such as a refrigerated and/or heated unit, in which the device board 502 and the lasers received thereon can be placed to control the ambient temperature of the lasers. The climate-controlled environment can be adjusted manually or otherwise to maintain a particular ambient temperature or ambient temperature profile.

The drive circuitry 508 can be configured to generate a drive current deliverable to each laser on the device board 502, causing the lasers to emit optical signals. The computer 506 can be configured to receive data from the detector board 504 via the data acquisition circuitry 510 that is based upon the output from each laser. The computer 506 can then store the measured optical power output from each laser and/or display such information to a user. This allows the user, or the computer 506 when the computer is performing functions automatically, to determine whether a laser is to be removed from the device board 502 or subjected to additional burn-in processes. Alternately or additionally, other drive circuitry or components (not shown) can be provided for driving lasers in the device board 502 to emit optical signals during a high-power OBI or a TBI, or the like.

Figure 6:
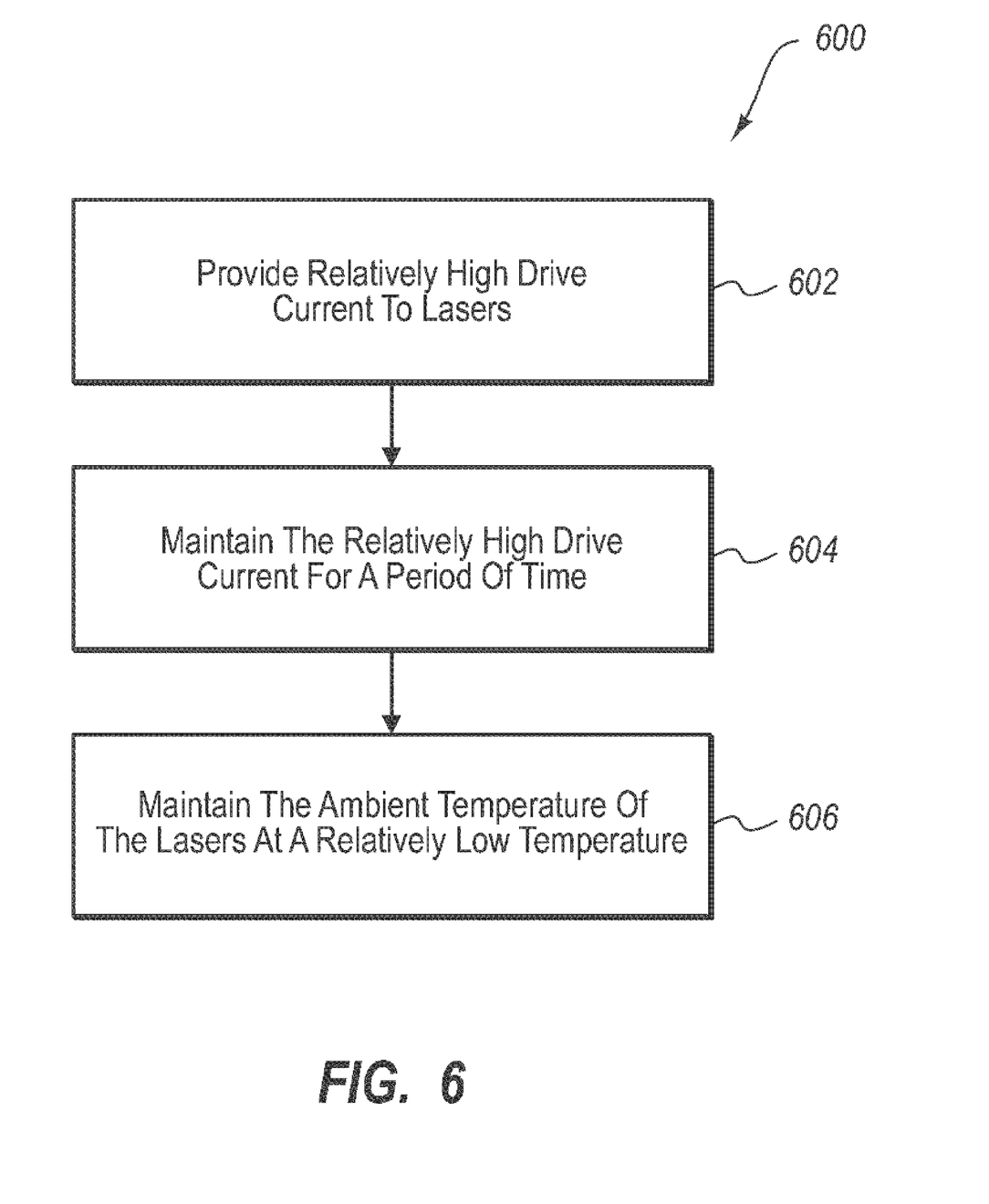
FIG. 6 illustrates an embodiment of a method for performing high-power OBI.

With combined reference to FIGS. 5 and 6, an example high-power OBI method 600 is now described that can be implemented in the test setup 500 of FIG. 5 or in other testing environments. The high-power OBI method 600 begins after one or more lasers or other optical signal sources have been placed in the device board 502 and aligned with one or more corresponding detectors on the detector board 504. The high-power OBI 600 begins by providing 602 a relatively high drive current to each of the lasers being tested. The relatively high drive current can be a pulsed or CW current. The value of the relatively high drive current can be selected to produce maximum optical output power from the lasers. In some embodiments, for example, the relatively high drive current may be anywhere from 3 to 4 times the normal operating bias current at elevated ambient temperature (e.g., 85° C.) of the lasers being tested.

Although normal operating bias current at an elevated ambient temperature may vary from laser to laser, an average or theoretical operating bias current for the particular type of laser being tested can be used as a baseline for determining the value of the relatively high drive current for each of the lasers being tested. Alternately or additionally, the operating bias current of each laser under test can be determined individually to allow the relatively high drive current to be determined individually for each laser.

As an example, the normal operating bias currents for a plurality of InAlGaAs 10 G FP lasers may vary from about 50 mA to 60 mA. For a 10 G FP RWG laser with a ridge that is 2 microns wide and 200 microns long and a MQW active region with eight quantum wells, a 50 mA-60 mA normal operating bias current can also be expressed as 1.56 kA/cm$^2$-1.87 kA/cm$^2$ per quantum well. Thus, the relatively high drive current during the burn-in process 700 may range from 150 mA-240 mA, which is approximately equal to 4.68 kA/cm$^2$-7.48 kA/cm$^2$ per quantum well. It is understood that the specific operating bias current and drive current values provided herein are given by way of example only, and should not be construed to limit the invention.

The high-power OBI method 600 continues by maintaining 604 the relatively high drive current to the lasers for a particular period of time—referred to as the "OBI duration". The OBI duration may be approximately ten minutes in some embodiments. Alternately or additionally, the OBI duration may be approximately five hours. Alternately or additionally, the OBI duration may be approximately one-hundred hours. Having said that, it will be appreciated that the OBI duration can be virtually any time period as little as ten minutes or less and up to one-hundred hours or more. Those skilled in the art will appreciate, with the benefit of the present disclosure, that the value of the OBI duration can be optimized depending on various factors including the design of the lasers being tested, the semiconductor materials making up the lasers, and the test conditions such as drive current and ambient temperature of the high-power OBI 600.

The high-power OBI method 600 concludes by maintaining 606 the ambient temperature of the lasers at a relatively low temperature. For instance, the ambient temperature may be selected from the range of temperatures lower than 50° C. In some embodiments, the ambient temperature is selected from the range of temperatures from negative 40° C. up to as much as 50° C. For example, the ambient temperature can be maintained at or around room temperature or 25° C.

According to embodiments of the invention, the high-power OBI process 600 can be implemented alone or in conjunction with conventional TBI processes and/or other aging techniques to maximize the identification and removal of weak lasers from a given set or population of lasers. One embodiment of a method 700 for accelerating the aging of multiple lasers to determine the reliability of the lasers, and that incorporates high-power OBI, is disclosed in FIG. 7.

The method 700 can be implemented using the test setup 500 of FIG. 5 including a device board 502, detector board 504, test computer 506, drive circuitry 508, and data acquisition circuitry 510, and/or other equipment, for example. The method 700 of FIG. 7 can optionally include various steps not depicted in FIG. 7, such as placing the lasers in the device board 502, aligning the lasers with corresponding optical detectors on the detector board 504, and so on.

Figure 7:
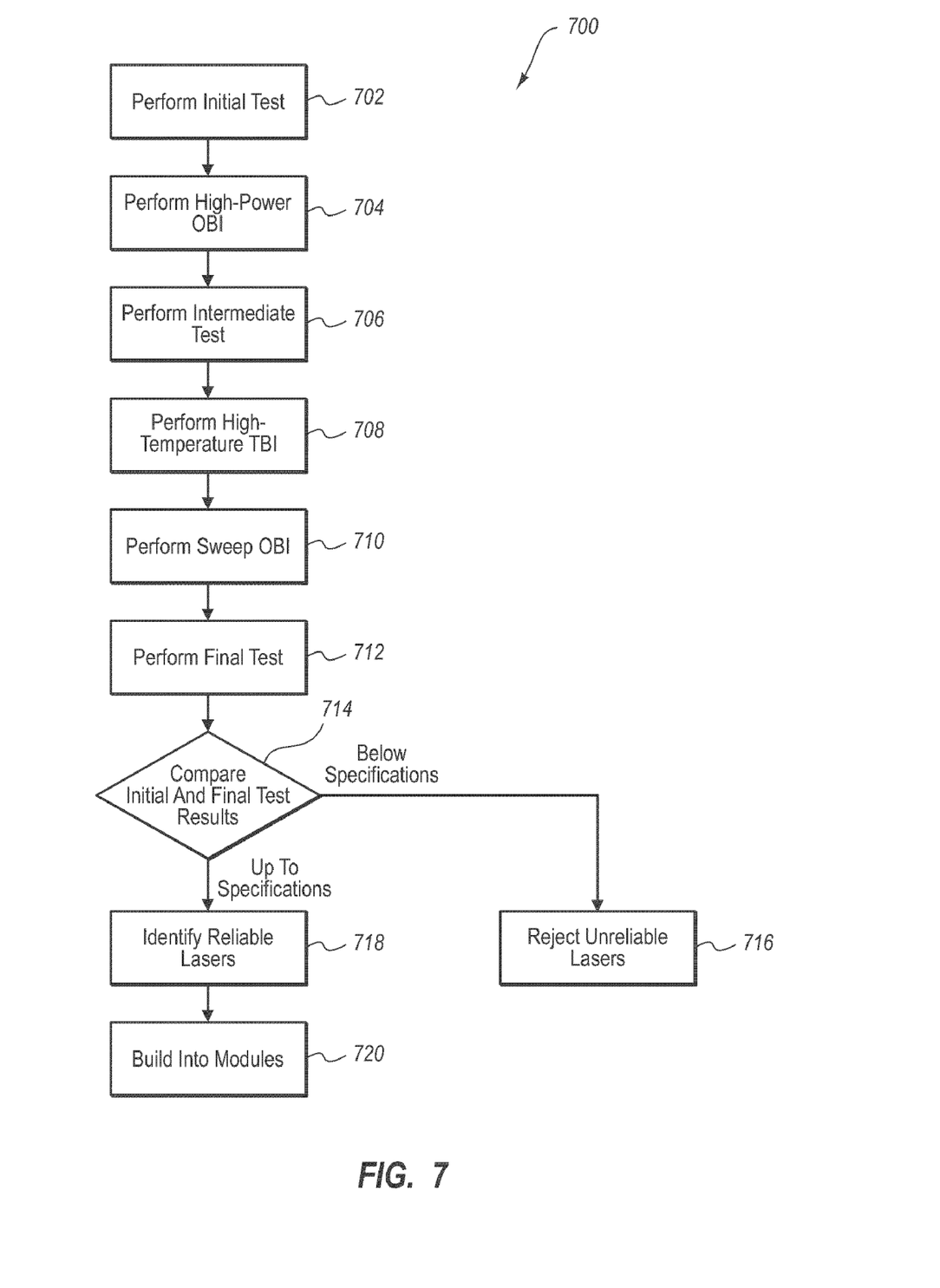
FIG. 7 depicts an embodiment of a method for aging lasers to identify weak or flawed devices.

The method 700 begins by performing 702 an initial test, which may include determining the initial optical output power for each of the lasers at a particular initial drive current. The initial drive current may be approximately equal to the average operating bias current of the type of lasers being tested, although other drive currents can alternately be used. The drive circuitry 508 may generate the initial drive current for each laser, causing each laser to emit an optical signal, the optical power of which can be measured by a corresponding optical detector on detector board 504. The power measurements from the detector board 504 can be received and stored by the test computer 506 for later use. In particular, the power measurements determined during the initial test can serve as a baseline for determining if a laser is weak and/or flawed.

At step 704, a high-power OBI is performed on the lasers that may correspond to the high-power OBI 600 of FIG. 6. The high-power OBI can include providing a drive current to the lasers for a particular OBI duration, the drive current being three to four times greater than the operating current of the lasers, while maintaining the ambient temperature of the lasers at or about a particular temperature less than 50° C.

The method 700 can continue at any one of optional steps 706-710 or proceed directly to step 712. For instance, at optional step 706, an intermediate test can be performed similar to the initial test performed at step 702. The intermediate test can include determining an intermediate optical output power for each of the lasers using the same drive current as in step 702. The intermediate optical output power can then be compared 714 by the test computer 506 (or by hand) to the initial optical output power to identify and reject 716 any lasers that are no longer performing within specifications, as described in greater detail below.

At optional step 708, a high-temperature TBI process can be performed on the lasers. The high-temperature TBI of step 708 can be performed on all the lasers. Alternately, the high-temperature TBI can be performed only on those lasers that are still performing within specifications after performing the intermediate test 706 and comparing the intermediate optical output power to the initial optical output power to identify and reject lasers no longer performing within specifications.

At optional step 710, a sweep OBI can be performed on the lasers under drive current and ambient temperature conditions that can be similar to drive current and ambient temperature conditions applied during the high-power OBI of step 704. For example, the sweep OBI can include a sweep to 200 mA CW drive current and 60 mW of power at approximately 35° C. ambient temperature, for example. Alternately, a pulsed or CW drive current that is higher or lower than 200 mA and an ambient temperature higher or lower than 35° C. can be applied during the sweep OBI. The duration of the sweep OBI can be several seconds per laser in some embodiments. The sweep OBI of optional step 710 serves to screen out parts that weakened significantly during the TBI process, using an optical stress far above that experienced during normal operation. This leaves a significant margin for degradation before the strength of the parts falls below the normal stress level, and assures a significant "failure free period".

The method 700 proceeds by performing 712 a final test on the lasers. Similar to the initial test of step 702 and the optional intermediate test of step 706, the final test of step 712 can include determining a final optical output power for each of the lasers using the same drive current as in the initial test of step 702. The final optical output power can be received and stored by the computer 506 of FIG. 5.

The computer 506 can then compare 714 the final optical output power to the initial optical output power to determine which lasers are still performing within desired specifications and thereby identify which lasers are reliable and which are unreliable. For example, a laser whose final optical power has dropped more than a specified amount, such as 2%, compared to the initial optical power can be identified as a flawed and unreliable laser and can be rejected 716. Alternately, the final optical power can be compared to a specified lower limit and all lasers with final optical power below the specified lower limit can be rejected 716. Rejecting 716 unreliable lasers can include discarding the unreliable lasers so they are not incorporated into any modules or units distributed to customers.

On the other hand, a laser whose final optical power has dropped less than the specified amount, or with a final optical power above the specified lower limit can be identified 718 as reliable and can optionally be used 720 in the manufacture of modules or units that include lasers.

One skilled in the art will appreciate, with the benefit of the present disclosure, that the method 700 is an example only, and modifications thereof can be made according to a particular need or desire. For example, embodiments within the scope of the invention can omit step 702 of performing the initial test to determine the initial optical output power of the lasers if the final optical output power is compared to a particular standard or specification, rather than to the initial optical output power. Alternately or additionally, embodiments of the invention can include a step of ascertaining the reliability of the lasers, which may include measuring the initial and/or final optical power and comparing one or both measurements to each other or to a particular standard or specification.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. A method of aging an optical signal source to determine the reliability of the optical signal source, the method comprising:
   providing a first drive current to an optical signal source, the first drive current being at least three times greater than a normal operating bias current of the optical signal source;
   maintaining the first drive current to the optical signal source for a first period of time, the first period of time being five hours or more; and
   maintaining the ambient temperature of the optical signal source at or below a first temperature during the first period of time, the first temperature being 50 degrees Celsius or lower.

2. The method of claim 1, further comprising, after providing the first drive current to the optical signal source for the first period of time, performing thermal burn-in on the optical signal source.

3. The method of claim 2, wherein performing thermal burn-in on the optical signal source includes providing a second drive current to the optical signal source for a second period of time while maintaining the ambient temperature of the optical signal source at a second temperature, the second drive current being approximately two times greater than the normal operating bias current of the optical signal source.

4. The method of claim 1, further comprising, ascertaining the reliability of the optical signal source.

5. The method of claim 4, wherein ascertaining the reliability of the optical signal source includes:
   prior to providing the first drive current to the optical signal source for the first period of time, measuring the initial optical output power of the optical signal source;
   after providing the first drive current to the optical signal source for the first period of time, measuring the final optical output power of the optical signal source; and
   comparing the final optical output power to the initial optical output power.

6. The method of claim 5, wherein when the final optical output power drops at least 2% compared to the initial optical output power, the optical signal source is determined to be unreliable.

7. The method of claim 1, wherein the first drive current is between three and four times greater than the normal operating bias current of the optical signal source.

8. The method of claim 1, wherein the first drive current is between 150 milliamps and 240 milliamps.

9. The method of claim 1, wherein the first period of time is approximately one-hundred hours.

* * * * *